US010261196B2

(12) United States Patent
Goederer et al.

(10) Patent No.: US 10,261,196 B2
(45) Date of Patent: Apr. 16, 2019

(54) RADIATION DETECTOR AND METHOD FOR OPERATING A RADIATION DETECTOR

(71) Applicant: Siemens Healthcare GmbH, Erlangen (DE)

(72) Inventors: Edgar Goederer, Forchheim (DE); Michael Hosemann, Erlangen (DE)

(73) Assignee: SIEMENS HEALTHCARE GMBH, Erlangen (DE)

( * ) Notice: Subject to any disclaimer, the term of this patent is extended or adjusted under 35 U.S.C. 154(b) by 0 days.

(21) Appl. No.: 16/008,175

(22) Filed: Jun. 14, 2018

(65) Prior Publication Data
US 2018/0372887 A1 Dec. 27, 2018

(30) Foreign Application Priority Data
Jun. 21, 2017 (EP) .................................... 17177142

(51) Int. Cl.
*G01T 1/17* (2006.01)
*H01L 27/146* (2006.01)
(52) U.S. Cl.
CPC .......... *G01T 1/17* (2013.01); *H01L 27/14634* (2013.01); *H01L 27/14636* (2013.01)

(58) Field of Classification Search
CPC . G01T 1/17; H01L 27/14634; H01L 27/1636; H01L 27/14636
See application file for complete search history.

(56) References Cited

U.S. PATENT DOCUMENTS

| 9,316,749 B2 | 4/2016 | Okada |
| 2015/0108354 A1 | 4/2015 | Liu et al. |
| 2016/0313456 A1 | 10/2016 | Prendergast et al. |

FOREIGN PATENT DOCUMENTS

WO  WO-2017036619 A1  3/2017

*Primary Examiner* — Mark R Gaworecki
(74) *Attorney, Agent, or Firm* — Harness, Dickey & Pierce, P.L.C.

(57) ABSTRACT

A radiation detector is disclosed. The radiation detector includes a sensor unit having a plurality of sensor elements for generating a sensor signal; an evaluation unit having a plurality of evaluation elements for evaluating and converting the sensor signal into an output signal; and a signal processing unit directly following the evaluation unit for processing the output signal, each evaluation element being connected to an associated sensor element via a respective electrical interconnect element including an interconnect capacitance and an individual length. The interconnect capacitances are different and as a result lead to different signal properties being exhibited by the output signals. At least some of the evaluation elements including an additional actuating element, the actuating elements of different evaluation elements being different from one another and being chosen such that the different signal properties of the output signals are aligned.

23 Claims, 2 Drawing Sheets

RADIATION DETECTOR AND METHOD FOR OPERATING A RADIATION DETECTOR

PRIORITY STATEMENT

The present application hereby claims priority under 35 U.S.C. § 119 to European patent application number EP17177142.1 filed Jun. 21, 2017, the entire contents of which are hereby incorporated herein by reference.

FIELD

At least one embodiment of the invention generally relates to a radiation detector and/or to a method for operating a radiation detector.

BACKGROUND

Imaging devices in the medical diagnostics field, in particular in diagnostic radiology, typically comprise a radiation detector, in particular an X-ray radiation detector, or X-ray detector for short. Imaging devices are generally understood in the present context to mean X-ray machines and specifically computed tomography systems.

X-ray detectors are usually embodied as scintillator detectors or as photon-counting detectors having a direct converter.

Scintillator detectors comprise a scintillator material. Scintillator materials are excited as a result of being irradiated with X-ray radiation and emit the excitation energy in the form of light. The emitted light is subsequently converted, for example via sensor elements embodied as photodiodes, into an electrical sensor signal to produce an output signal, in particular into an electrical current, also known as a signal current, and evaluated in an evaluation unit, the latter usually comprising a plurality of evaluation elements. To that end, each evaluation element usually includes an application-specific integrated circuit (ASIC). The output signal may also have a current pulse, for example, though such current pulses occur only in the case of photon-counting direct converters.

Scintillator detectors frequently comprise a plurality of scintillator elements which are arranged in the manner of an array. Analogously, the sensor elements and the evaluation elements likewise comprise an arrangement in the manner of an array.

Radiation detectors having direct converters usually contain a semiconductor material, for example a semiconductor based on cadmium telluride (CdTe), which converts incident radiation, for example X-ray radiation, into an electrical output signal, in particular into a current pulse.

The two types of detector in each case feature a matrix-like arrangement, both of the sensor elements and of the evaluation elements. In this connection, the sensor elements are also referred to as sensor pixels and the evaluation elements as evaluation pixels.

In order to evaluate the signal currents, a sensor element typically has an electrical connection to an evaluation element associated with it via an electrical interconnect element, for example an electrical line element. The signal currents are typically evaluated in the evaluation unit to produce an output signal and converted, into an image, for example, in a signal processing unit that usually directly follows the evaluation unit.

Because small currents are often evaluated via the evaluation unit and electrical lines typically exhibit parasitic effects, for example parasitic capacitances, the sensor unit and the evaluation unit are frequently embodied as coextensive in area and are arranged one placed on top of the other in order to keep the length of the electrical interconnect elements to a minimum. By small currents, in the present context, are understood electrical currents having a value in the range from 1 pA to 1 µA (per evaluation element). In order to evaluate such small signal currents, each evaluation element typically comprises in addition for example an amplifier unit for amplifying the signal currents and consequently also for amplifying the output signal.

Coextensive embodiment is understood in the present context to mean that the sensor unit and the evaluation unit in each case have a length and a width which each have an equal value, except for a tolerance of <20%, in particular <10%. This applies analogously to the number and distribution of the individual elements (sensor elements and evaluation elements), as well as to a surface area profile, for example in the shape of a rectangle, of the elements (sensor elements and evaluation elements). Furthermore, the sensor unit and the evaluation unit are arranged one on top of the other in a form-fitting manner. This ensures that each sensor element has associated with it an evaluation element which is disposed "opposite" the sensor element. The length of the electrical connection between a sensor element and its associated evaluation element is reduced as a result. In particular, the already mentioned shortest possible electrical connection between the sensor elements and the evaluation elements is guaranteed by this configuration.

SUMMARY

The inventors have discover that, as a result of the short electrical connection, the latter typically exhibits minimal parasitic effects, since there is a progressive correlation in particular between a length of an electrical line and the magnitude of parasitic effects. Progressive correlation is understood in the present context to mean that as a value for a length of an electrical connection, in particular an electrical line, increases, parasitic effects occurring in the line, for example the value of a parasitic capacitance of the electrical line, likewise exhibit an increasing progression.

In particular, the inventors have discover that the evaluation unit often has a disadvantageous area ratio between a total surface area of the evaluation unit and a surface area of the evaluation unit that is "actively" used by evaluation elements. By this is understood in the present context that a large part of the surface area of the evaluation unit is not used in accordance with the actual purpose of the evaluation unit from the circuit layout standpoint. This leads to an undesirably disadvantageous element density. Element density is understood in the present context to mean a number of elements (sensor elements and evaluation element) in relation to a surface area on which the elements (sensor elements and evaluation element) are arranged.

In order to counteract this disadvantageous area ratio, the evaluation unit has a surface area which is formed exclusively by the individual surface areas of the evaluation elements. The total surface area of the evaluation unit is reduced as a result to the sum of the surface areas of the evaluation elements. Usually, therefore, the evaluation unit has no area that is "unused" in terms of circuit layout, except for manufacturing-related tolerances.

Consequently, the total surface area of the evaluation unit has a smaller value than the total surface area of the sensor unit. In other words, the sensor unit and the evaluation unit are not coextensive in area in the present instance. As a result, at least some of the electrical connections between the individual sensor elements and the associated evaluation elements, in particular in a peripheral region of the sensor and evaluation unit, have a different length.

Due to the different lengths of the electrical connections, the inventors have discover that the occurring parasitic effects, in particular the occurring parasitic capacitances, have different values. This has a disadvantageous impact on for example a pulse shape of the electrical output signal, a noise of the amplified output signal, and in particular a uniformity of the noise across the individual evaluation elements. Consequently, this also disadvantageously affects the image quality of the radiation detector. Effects of such kind, for example the already cited noise, lead for example to an uneven image quality and therefore detract from the diagnostic value of the acquired X-ray images.

At least one embodiment of the invention discloses a radiation detector in which artifacts due to such parasitic effects are at least reduced.

At least one embodiment of the invention is directed to a radiation detector, in particular an X-ray detector; and/or a method for operating a radiation detector.

Advantageous embodiments, developments and variants are the subject matter of the claims.

The advantages cited with regard to the radiation detector and the preferred embodiments are to be applied analogously to the method, and vice versa.

The radiation detector of at least one embodiment comprises a sensor unit having a plurality of sensor elements for generating a sensor signal. In addition, the radiation detector comprises an evaluation unit having a plurality of evaluation elements. In this arrangement, the number of sensor elements preferably corresponds to the number of evaluation elements. By way of the evaluation elements it is made possible to evaluate the sensor signal and to convert the sensor signal into an output signal. In order to process the output signal, the radiation detector additionally comprises a signal processing unit directly following the evaluation unit.

Each evaluation element is associated with a sensor element and for this purpose is connected in an electrically conductive manner to the respective associated sensor element via an electrical interconnect element, for example an electrical line. The electrical interconnect elements take the form for example of an electrical line composed of strands, preferably a conductor track on a printed circuit board. The electrical interconnect element has an interconnect capacitance, for example a parasitic capacitance, as well as an individual length. Interconnect capacitance is generally understood in the present context to mean for example a capacitance per unit length, a fringe capacitance and/or a parasitic capacitance.

At least one embodiment of the invention is directed to a method for operating a radiation detector.

BRIEF DESCRIPTION OF THE DRAWINGS

Example embodiments of the invention are explained in more detail below with reference to the figures. These show, in some cases in greatly simplified representations.

Figure 1:
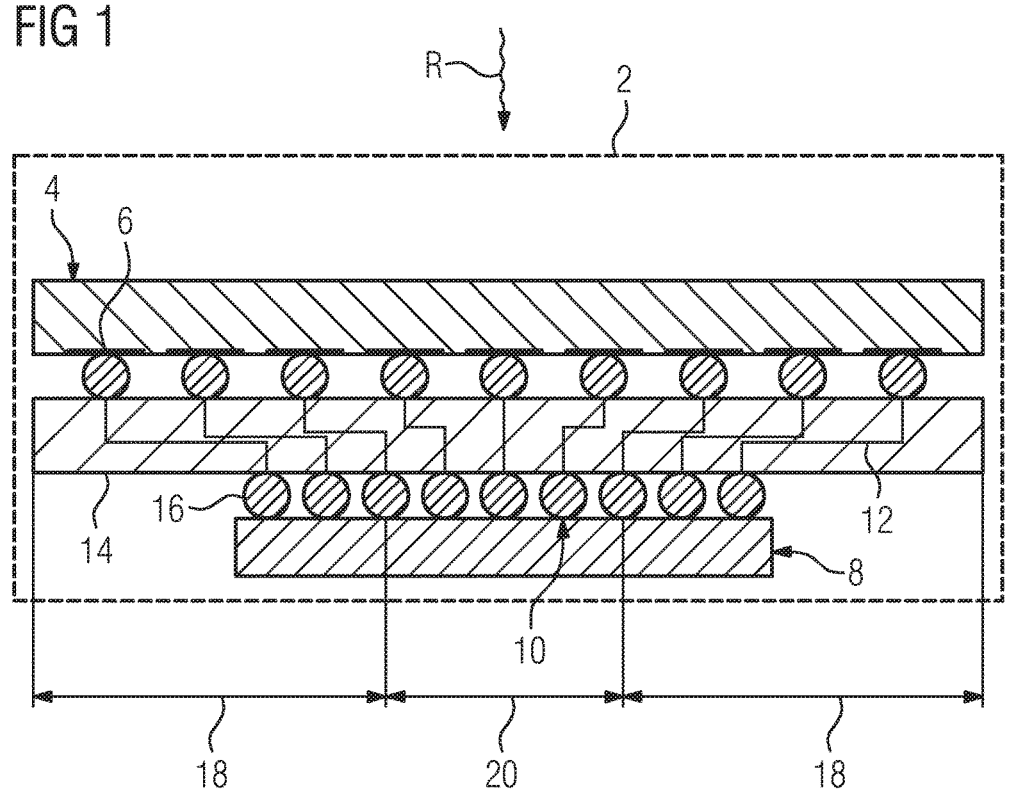
FIG. 1 a cross-sectional view of a sensor unit arranged opposite an evaluation unit inside a radiation detector, FIG. 2 a greatly simplified block diagram of a circuit of a radiation detector according to a first embodiment, and FIG. 3 a greatly simplified block diagram of a circuit of a radiation detector according to a second embodiment.

In the figures, like-acting parts are labeled with the same reference signs.

DETAILED DESCRIPTION OF THE EXAMPLE EMBODIMENTS

The drawings are to be regarded as being schematic representations and elements illustrated in the drawings are not necessarily shown to scale. Rather, the various elements are represented such that their function and general purpose become apparent to a person skilled in the art. Any connection or coupling between functional blocks, devices, components, or other physical or functional units shown in the drawings or described herein may also be implemented by an indirect connection or coupling. A coupling between components may also be established over a wireless connection. Functional blocks may be implemented in hardware, firmware, software, or a combination thereof.

Various example embodiments will now be described more fully with reference to the accompanying drawings in which only some example embodiments are shown. Specific structural and functional details disclosed herein are merely representative for purposes of describing example embodiments. Example embodiments, however, may be embodied in various different forms, and should not be construed as being limited to only the illustrated embodiments. Rather, the illustrated embodiments are provided as examples so that this disclosure will be thorough and complete, and will fully convey the concepts of this disclosure to those skilled in the art. Accordingly, known processes, elements, and techniques, may not be described with respect to some example embodiments. Unless otherwise noted, like reference characters denote like elements throughout the attached drawings and written description, and thus descriptions will not be repeated. The present invention, however, may be embodied in many alternate forms and should not be construed as limited to only the example embodiments set forth herein.

It will be understood that, although the terms first, second, etc. may be used herein to describe various elements, components, regions, layers, and/or sections, these elements, components, regions, layers, and/or sections, should not be limited by these terms. These terms are only used to distinguish one element from another. For example, a first element could be termed a second element, and, similarly, a second element could be termed a first element, without departing from the scope of example embodiments of the present invention. As used herein, the term "and/or," includes any and all combinations of one or more of the associated listed items. The phrase "at least one of" has the same meaning as "and/or".

Spatially relative terms, such as "beneath," "below," "lower," "under," "above," "upper," and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below," "beneath," or "under," other elements or features would then be oriented "above" the other elements or features. Thus, the example terms "below" and "under" may encompass both an orientation of above and below. The device may be otherwise oriented (rotated 90 degrees or at other orientations) and the spatially relative descriptors used herein interpreted accordingly. In addition, when an element is referred to as being "between" two elements, the element may be the only element between the two elements, or one or more other intervening elements may be present.

Spatial and functional relationships between elements (for example, between modules) are described using various terms, including "connected," "engaged," "interfaced," and "coupled." Unless explicitly described as being "direct," when a relationship between first and second elements is described in the above disclosure, that relationship encompasses a direct relationship where no other intervening elements are present between the first and second elements, and also an indirect relationship where one or more intervening elements are present (either spatially or functionally) between the first and second elements. In contrast, when an element is referred to as being "directly" connected, engaged, interfaced, or coupled to another element, there are no intervening elements present. Other words used to describe the relationship between elements should be interpreted in a like fashion (e.g., "between," versus "directly between," "adjacent," versus "directly adjacent," etc.).

The terminology used herein is for the purpose of describing particular embodiments only and is not intended to be limiting of example embodiments of the invention. As used herein, the singular forms "a," "an," and "the," are intended to include the plural forms as well, unless the context clearly indicates otherwise. As used herein, the terms "and/or" and "at least one of" include any and all combinations of one or more of the associated listed items. It will be further understood that the terms "comprises," "comprising," "includes," and/or "including," when used herein, specify the presence of stated features, integers, steps, operations, elements, and/or components, but do not preclude the presence or addition of one or more other features, integers, steps, operations, elements, components, and/or groups thereof. As used herein, the term "and/or" includes any and all combinations of one or more of the associated listed items. Expressions such as "at least one of," when preceding a list of elements, modify the entire list of elements and do not modify the individual elements of the list. Also, the term "exemplary" is intended to refer to an example or illustration.

When an element is referred to as being "on," "connected to," "coupled to," or "adjacent to," another element, the element may be directly on, connected to, coupled to, or adjacent to, the other element, or one or more other intervening elements may be present. In contrast, when an element is referred to as being "directly on," "directly connected to," "directly coupled to," or "immediately adjacent to," another element there are no intervening elements present.

It should also be noted that in some alternative implementations, the functions/acts noted may occur out of the order noted in the figures. For example, two figures shown in succession may in fact be executed substantially concurrently or may sometimes be executed in the reverse order, depending upon the functionality/acts involved.

Unless otherwise defined, all terms (including technical and scientific terms) used herein have the same meaning as commonly understood by one of ordinary skill in the art to which example embodiments belong. It will be further understood that terms, e.g., those defined in commonly used dictionaries, should be interpreted as having a meaning that is consistent with their meaning in the context of the relevant art and will not be interpreted in an idealized or overly formal sense unless expressly so defined herein.

Before discussing example embodiments in more detail, it is noted that some example embodiments may be described with reference to acts and symbolic representations of operations (e.g., in the form of flow charts, flow diagrams, data flow diagrams, structure diagrams, block diagrams, etc.) that may be implemented in conjunction with units and/or devices discussed in more detail below. Although discussed in a particularly manner, a function or operation specified in a specific block may be performed differently from the flow specified in a flowchart, flow diagram, etc. For example, functions or operations illustrated as being performed serially in two consecutive blocks may actually be performed simultaneously, or in some cases be performed in reverse order. Although the flowcharts describe the operations as sequential processes, many of the operations may be performed in parallel, concurrently or simultaneously. In addition, the order of operations may be re-arranged. The processes may be terminated when their operations are completed, but may also have additional steps not included in the figure. The processes may correspond to methods, functions, procedures, subroutines, subprograms, etc.

Specific structural and functional details disclosed herein are merely representative for purposes of describing example embodiments of the present invention. This invention may, however, be embodied in many alternate forms and should not be construed as limited to only the embodiments set forth herein.

Units and/or devices according to one or more example embodiments may be implemented using hardware, software, and/or a combination thereof. For example, hardware devices may be implemented using processing circuitry such as, but not limited to, a processor, Central Processing Unit (CPU), a controller, an arithmetic logic unit (ALU), a digital signal processor, a microcomputer, a field programmable gate array (FPGA), a System-on-Chip (SoC), a programmable logic unit, a microprocessor, or any other device capable of responding to and executing instructions in a defined manner. Portions of the example embodiments and corresponding detailed description may be presented in terms of software, or algorithms and symbolic representations of operation on data bits within a computer memory. These descriptions and representations are the ones by which those of ordinary skill in the art effectively convey the substance of their work to others of ordinary skill in the art. An algorithm, as the term is used here, and as it is used generally, is conceived to be a self-consistent sequence of steps leading to a desired result. The steps are those requiring physical manipulations of physical quantities. Usually, though not necessarily, these quantities take the form of optical, electrical, or magnetic signals capable of being stored, transferred, combined, compared, and otherwise manipulated. It has proven convenient at times, principally for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantities. Unless specifically stated otherwise, or as is apparent from the discussion, terms such as "processing" or "computing" or "calculating" or "determining" of "displaying" or the like, refer to the action and processes of a computer system, or similar electronic computing device/ hardware, that manipulates and transforms data represented as physical, electronic quantities within the computer system's registers and memories into other data similarly represented as physical quantities within the computer system memories or registers or other such information storage, transmission or display devices.

In this application, including the definitions below, the term 'module' or the term 'controller' may be replaced with the term 'circuit.' The term 'module' may refer to, be part of, or include processor hardware (shared, dedicated, or group) that executes code and memory hardware (shared, dedicated, or group) that stores code executed by the processor hardware.

The module may include one or more interface circuits. In some examples, the interface circuits may include wired or wireless interfaces that are connected to a local area network (LAN), the Internet, a wide area network (WAN), or combinations thereof. The functionality of any given module of the present disclosure may be distributed among multiple modules that are connected via interface circuits. For example, multiple modules may allow load balancing. In a further example, a server (also known as remote, or cloud) module may accomplish some functionality on behalf of a client module.

Software may include a computer program, program code, instructions, or some combination thereof, for independently or collectively instructing or configuring a hardware device to operate as desired. The computer program and/or program code may include program or computer-readable instructions, software components, software modules, data files, data structures, and/or the like, capable of being implemented by one or more hardware devices, such as one or more of the hardware devices mentioned above. Examples of program code include both machine code produced by a compiler and higher level program code that is executed using an interpreter.

For example, when a hardware device is a computer processing device (e.g., a processor, Central Processing Unit (CPU), a controller, an arithmetic logic unit (ALU), a digital signal processor, a microcomputer, a microprocessor, etc.), the computer processing device may be configured to carry out program code by performing arithmetical, logical, and input/output operations, according to the program code. Once the program code is loaded into a computer processing device, the computer processing device may be programmed to perform the program code, thereby transforming the computer processing device into a special purpose computer processing device. In a more specific example, when the program code is loaded into a processor, the processor becomes programmed to perform the program code and operations corresponding thereto, thereby transforming the processor into a special purpose processor.

Software and/or data may be embodied permanently or temporarily in any type of machine, component, physical or virtual equipment, or computer storage medium or device, capable of providing instructions or data to, or being interpreted by, a hardware device. The software also may be distributed over network coupled computer systems so that the software is stored and executed in a distributed fashion. In particular, for example, software and data may be stored by one or more computer readable recording mediums, including the tangible or non-transitory computer-readable storage media discussed herein.

Even further, any of the disclosed methods may be embodied in the form of a program or software. The program or software may be stored on a non-transitory computer readable medium and is adapted to perform any one of the aforementioned methods when run on a computer device (a device including a processor). Thus, the non-transitory, tangible computer readable medium, is adapted to store information and is adapted to interact with a data processing facility or computer device to execute the program of any of the above mentioned embodiments and/or to perform the method of any of the above mentioned embodiments.

Example embodiments may be described with reference to acts and symbolic representations of operations (e.g., in the form of flow charts, flow diagrams, data flow diagrams, structure diagrams, block diagrams, etc.) that may be implemented in conjunction with units and/or devices discussed in more detail below. Although discussed in a particularly manner, a function or operation specified in a specific block may be performed differently from the flow specified in a flowchart, flow diagram, etc. For example, functions or operations illustrated as being performed serially in two consecutive blocks may actually be performed simultaneously, or in some cases be performed in reverse order.

According to one or more example embodiments, computer processing devices may be described as including various functional units that perform various operations and/or functions to increase the clarity of the description. However, computer processing devices are not intended to be limited to these functional units. For example, in one or more example embodiments, the various operations and/or functions of the functional units may be performed by other ones of the functional units. Further, the computer processing devices may perform the operations and/or functions of the various functional units without sub-dividing the operations and/or functions of the computer processing units into these various functional units.

Units and/or devices according to one or more example embodiments may also include one or more storage devices. The one or more storage devices may be tangible or non-transitory computer-readable storage media, such as random access memory (RAM), read only memory (ROM), a permanent mass storage device (such as a disk drive), solid state (e.g., NAND flash) device, and/or any other like data storage mechanism capable of storing and recording data. The one or more storage devices may be configured to store computer programs, program code, instructions, or some combination thereof, for one or more operating systems and/or for implementing the example embodiments described herein. The computer programs, program code, instructions, or some combination thereof, may also be loaded from a separate computer readable storage medium into the one or more storage devices and/or one or more computer processing devices using a drive mechanism. Such separate computer readable storage medium may include a Universal Serial Bus (USB) flash drive, a memory stick, a Blu-ray/DVD/CD-ROM drive, a memory card, and/or other like computer readable storage media. The computer programs, program code, instructions, or some combination thereof, may be loaded into the one or more storage devices and/or the one or more computer processing devices from a remote data storage device via a network interface, rather than via a local computer readable storage medium. Additionally, the computer programs, program code, instructions, or some combination thereof, may be loaded into the one or more storage devices and/or the one or more processors from a remote computing system that is configured to transfer and/or distribute the computer programs, program code, instructions, or some combination thereof, over a network. The remote computing system may transfer and/or distribute the computer programs, program code, instructions, or some combination thereof, via a wired interface, an air interface, and/or any other like medium.

The one or more hardware devices, the one or more storage devices, and/or the computer programs, program code, instructions, or some combination thereof, may be specially designed and constructed for the purposes of the example embodiments, or they may be known devices that are altered and/or modified for the purposes of example embodiments.

A hardware device, such as a computer processing device, may run an operating system (OS) and one or more software applications that run on the OS. The computer processing device also may access, store, manipulate, process, and create data in response to execution of the software. For simplicity, one or more example embodiments may be exemplified as a computer processing device or processor; however, one skilled in the art will appreciate that a hardware device may include multiple processing elements or processors and multiple types of processing elements or processors. For example, a hardware device may include multiple processors or a processor and a controller. In addition, other processing configurations are possible, such as parallel processors.

The computer programs include processor-executable instructions that are stored on at least one non-transitory computer-readable medium (memory). The computer programs may also include or rely on stored data. The computer programs may encompass a basic input/output system (BIOS) that interacts with hardware of the special purpose computer, device drivers that interact with particular devices of the special purpose computer, one or more operating systems, user applications, background services, background applications, etc. As such, the one or more processors may be configured to execute the processor executable instructions.

The computer programs may include: (i) descriptive text to be parsed, such as HTML (hypertext markup language) or XML (extensible markup language), (ii) assembly code, (iii) object code generated from source code by a compiler, (iv) source code for execution by an interpreter, (v) source code for compilation and execution by a just-in-time compiler, etc. As examples only, source code may be written using syntax from languages including C, C++, C#, Objective-C, Haskell, Go, SQL, R, Lisp, Java®, Fortran, Perl, Pascal, Curl, OCaml, Javascript®, HTML5, Ada, ASP (active server pages), PHP, Scala, Eiffel, Smalltalk, Erlang, Ruby, Flash®, Visual Basic®, Lua, and Python®.

Further, at least one embodiment of the invention relates to the non-transitory computer-readable storage medium including electronically readable control information (processor executable instructions) stored thereon, configured in such that when the storage medium is used in a controller of a device, at least one embodiment of the method may be carried out.

The computer readable medium or storage medium may be a built-in medium installed inside a computer device main body or a removable medium arranged so that it can be separated from the computer device main body. The term computer-readable medium, as used herein, does not encompass transitory electrical or electromagnetic signals propagating through a medium (such as on a carrier wave); the term computer-readable medium is therefore considered tangible and non-transitory. Non-limiting examples of the non-transitory computer-readable medium include, but are not limited to, rewriteable non-volatile memory devices (including, for example flash memory devices, erasable programmable read-only memory devices, or a mask read-only memory devices); volatile memory devices (including, for example static random access memory devices or a dynamic random access memory devices); magnetic storage media (including, for example an analog or digital magnetic tape or a hard disk drive); and optical storage media (including, for example a CD, a DVD, or a Blu-ray Disc). Examples of the media with a built-in rewriteable non-volatile memory, include but are not limited to memory cards; and media with a built-in ROM, including but not limited to ROM cassettes; etc. Furthermore, various information regarding stored images, for example, property information, may be stored in any other form, or it may be provided in other ways.

The term code, as used above, may include software, firmware, and/or microcode, and may refer to programs, routines, functions, classes, data structures, and/or objects. Shared processor hardware encompasses a single microprocessor that executes some or all code from multiple modules. Group processor hardware encompasses a microprocessor that, in combination with additional microprocessors, executes some or all code from one or more modules. References to multiple microprocessors encompass multiple microprocessors on discrete dies, multiple microprocessors on a single die, multiple cores of a single microprocessor, multiple threads of a single microprocessor, or a combination of the above.

Shared memory hardware encompasses a single memory device that stores some or all code from multiple modules. Group memory hardware encompasses a memory device that, in combination with other memory devices, stores some or all code from one or more modules.

The term memory hardware is a subset of the term computer-readable medium. The term computer-readable medium, as used herein, does not encompass transitory electrical or electromagnetic signals propagating through a medium (such as on a carrier wave); the term computer-readable medium is therefore considered tangible and non-transitory. Non-limiting examples of the non-transitory computer-readable medium include, but are not limited to, rewriteable non-volatile memory devices (including, for example flash memory devices, erasable programmable read-only memory devices, or a mask read-only memory devices); volatile memory devices (including, for example static random access memory devices or a dynamic random access memory devices); magnetic storage media (including, for example an analog or digital magnetic tape or a hard disk drive); and optical storage media (including, for example a CD, a DVD, or a Blu-ray Disc). Examples of the media with a built-in rewriteable non-volatile memory, include but are not limited to memory cards; and media with a built-in ROM, including but not limited to ROM cassettes; etc. Furthermore, various information regarding stored images, for example, property information, may be stored in any other form, or it may be provided in other ways.

The apparatuses and methods described in this application may be partially or fully implemented by a special purpose computer created by configuring a general purpose computer to execute one or more particular functions embodied in computer programs. The functional blocks and flowchart elements described above serve as software specifications, which can be translated into the computer programs by the routine work of a skilled technician or programmer.

Although described with reference to specific examples and drawings, modifications, additions and substitutions of example embodiments may be variously made according to the description by those of ordinary skill in the art. For example, the described techniques may be performed in an order different with that of the methods described, and/or components such as the described system, architecture, devices, circuit, and the like, may be connected or combined to be different from the above-described methods, or results may be appropriately achieved by other components or equivalents.

The radiation detector of at least one embodiment comprises a sensor unit having a plurality of sensor elements for generating a sensor signal. In addition, the radiation detector comprises an evaluation unit having a plurality of evaluation elements. In this arrangement, the number of sensor elements preferably corresponds to the number of evaluation elements. By way of the evaluation elements it is made possible to evaluate the sensor signal and to convert the sensor signal into an output signal. In order to process the output signal, the radiation detector additionally comprises a signal processing unit directly following the evaluation unit.

Each evaluation element is associated with a sensor element and for this purpose is connected in an electrically conductive manner to the respective associated sensor element via an electrical interconnect element, for example an electrical line. The electrical interconnect elements take the form for example of an electrical line composed of strands, preferably a conductor track on a printed circuit board. The electrical interconnect element has an interconnect capacitance, for example a parasitic capacitance, as well as an individual length. Interconnect capacitance is generally understood in the present context to mean for example a capacitance per unit length, a fringe capacitance and/or a parasitic capacitance.

By parasitic capacitance is generally understood an in most cases undesirable capacitance between two electrical line elements which, due to their charge and the distance separating them, exhibit a capacitance in the manner of a parallel-plate capacitor, which capacitance has an (electrically) disruptive effect. What is specifically understood by interconnect capacitance is in particular a parasitic capacitance of already cited type between the electrical interconnect elements.

Generally, individual capacitances of lines are characterized by a plurality of different capacitances, for example capacitances to ground and/or capacitances to other lines. With regard to at least one embodiment of the invention, in particular the parasitic capacitances to ground and parasitic capacitances to immediately neighboring line elements of a respective line element are relevant. By ground, in the present context, is generally understood the electrical zero potential.

As described in the introduction, the surface area of the sensor unit of the radiation detector has a different, in particular greater, value than the surface area of the evaluation unit. As a result thereof, the electrical interconnect elements have different, individual lengths, depending on a position of the sensor and evaluation elements that are interconnected by them. Preferably, the electrical interconnect elements have a length with a value in the range between 10 μm and 300 μm in a central region of the sensor unit and the evaluation unit, and a value in the range between 1 mm and 4 cm in a peripheral region of the sensor unit and the evaluation unit. In particular, both the sensor unit and the evaluation unit have a shape in the manner of a planar rectangle. Planar is to be understood in the present context to mean a plate-shaped embodiment. For reasons of symmetry and easier manufacture, at least some of the electrical interconnect elements have the same length, for example.

Furthermore, the value of the interconnect capacitance, in particular the value of the parasitic capacitance, is progressively correlated with the value of the length of the electrical interconnect element. In this respect, due to the different, individual lengths of the electrical interconnect elements, the interconnect capacitances of at least some of the electrical interconnect elements have a different value in each case. In other words, due to their different, individual lengths, at least some of the electrical interconnect elements have a different interconnect capacitance in each case.

Due to their different values, the different interconnect capacitances disrupt the output signals transmitted via the electrical interconnect elements, as a result of which the output signals exhibit different signal properties. Signal properties are understood in the present context specifically to mean a pulse shape (in particular a pulse width and a pulse height) and/or a noise of the output signals. Furthermore, the additional interconnect capacitance influences the noise of the output signal amplified via the amplifier unit.

Furthermore, at least some of the evaluation elements have an additional actuating element, for example a capacitance, the actuating elements of different evaluation elements being different from one another. The actuating elements are chosen such that the signal properties of the output signals transferred from the evaluation unit to the signal processing unit (the signal properties varying as a function of the different interconnect capacitances) are aligned.

In other words, in order to achieve a homogeneous response behavior of the evaluation unit, in particular with regard to the already described signal properties (for example the pulse width) and/or the noise of the output signal, it has proven advantageous to align the different interconnect capacitances in such a way that the different electrical interconnect elements preferably have an identical total capacitance. Response behavior is generally understood in the present context to mean a change to a signal that occurs due to a processing step, for example on the basis of a transmission function, inside a signal processing component (specifically, in the present case, a respective evaluation element).

This means that after the alignment each electrical interconnect element, irrespective of its length, has the same interconnect capacitance (the rule that applies in this case is: interconnect capacitance=total capacitance). In order to achieve a total capacitance value of such kind, the actuating elements of the different electrical interconnect elements each preferably have a balancing capacitance value corresponding to a difference between the total capacitance and the respective interconnect capacitance of the electrical interconnect element.

Owing to the fact that only an extension, in particular an increase, in a value of the different interconnect capacitances is made possible via the actuating elements, the electrical interconnect element whose interconnect capacitance has the greatest value serves as a minimum value for the value of the total capacitance.

The following example is intended to aid a better understanding:

A radiation detector comprises three sensor elements and three evaluation elements. One sensor element in each case is electrically connected to an evaluation element via an electrical interconnect element. In this respect, the radiation detector comprises three electrical interconnect elements, each of which has a different, individual length. Due to the different lengths of the electrical interconnect elements, these each have different interconnect capacitances. A first electrical interconnect element has an interconnect capacitance with a value of 200 fF, a second electrical interconnect element has an interconnect capacitance with a value of 350 fF, and a third electrical interconnect element has an interconnect capacitance with a value of 500 fF. The value of the total capacitance is therefore determined by the third electrical interconnect element—because, of all three interconnect capacitances, this has the highest value—as equal to a value (minimum value) of at least 500 fF. This value of 500 fF, for example, is defined as the value for the total capacitance. In order to align the different interconnect capacitances of the electrical interconnect elements to the total capacitance, the three electrical interconnect elements each have an actuating element having a balancing capacitance. The actuating element of the first electrical interconnect element has a balancing capacitance with a value of 300 fF (difference between total capacitance value and interconnect capacitance value: 500 fF−200 fF=300 fF). The actuating element of the second electrical interconnect element has a balancing capacitance with a value of 150 fF (difference between total capacitance value and interconnect capacitance value: 500 fF−350 fF=150 fF).

In particular an alignment of the signal properties of the output signals is achieved via the actuating elements, which has proven advantageous with regard to the image quality of the radiation detector. Furthermore, effects degrading image quality are preempted by way of the alignment, in particular the homogenization, of the signal properties of the output signals. In the present case, such effects are referred to as the pile-up effect and/or the paralysis effect. By pile-up effect, in the present context, is understood an effect in which, for example, two square-wave signal pulses touch each other on sides facing toward each other in such a way that a signal processing unit detects the two signal pulses as a single signal pulse having an overall duration of the two individual pulses. By the paralysis effect, in the present context, is understood the effect in which a counter unit of the detector misses pulses to be counted due to an overlapping of the pulses, for example due to the pile-up effect. While the counter unit "counts" a pulse, it is "paralyzed" for further count events, as a result of which fewer pulses are counted than actually occur as events.

The paralysis effect occurs in particular at high pulse frequencies. High pulse frequencies are understood in the present context to mean frequencies of pulses at which an average gap between two pulses has a smaller value than, for example, ten times an average full width at half maximum of one pulse.

Particularly preferably, at least some of the additional actuating elements have a different balancing capacitance. The advantage is that by this, it is a simple exercise, considered from the circuit layout standpoint, to achieve a balancing of the interconnect capacitances in the electrical interconnect elements in the manner already described.

In a beneficial embodiment, in order to match the actuating elements to the different values of the interconnect capacitances, in particular the parasitic capacitances, the actuating elements are adjustable in terms of their value. By adjustable, in the present context, is understood that the actuating elements have a variable balancing capacitance value, at least, for example, during the course of an installation into the radiation detector.

In a beneficial embodiment, each evaluation element comprises an application-specific integrated circuit (ASIC) having an amplifier element. The advantage of the embodiment lies in the fact that an explicitly application-specific circuit for evaluating the sensor signal is realized via the ASIC. By this, it is made possible in particular to integrate specific properties and/or application details of the radiation detector, for example the type of radiation detector (scintillator detector or direct-converting detector) into the circuit and thus enhance the image quality of the detector.

According to a preferred embodiment, the amplifier element comprises a signal input, a feedback input and a signal output. In addition, the amplifier element preferably comprises a resistive feedback element, for example an impedance, which connects the signal output to the feedback input. Alternatively, the amplifier element comprises a capacitive feedback element, for example a capacitor, or a combination composed of a resistive and a capacitive feedback element. By combination, in the present context, is specifically understood a feedback element which comprises both a resistive and a capacitive component.

With regard to the embodiment of the amplifier element, a homogenization of the signal properties can generally be realized via amplifier elements of known type.

According to a first embodiment variant, the actuating element is positioned in the circuit upstream of the signal input, in particular is connected to the signal input of the amplifier element. What is achieved by this, is a conceptually simple circuit layout and at the same time, considered in terms of circuit design, an easy balancing of the different interconnect capacitances, and consequently a homogenization of the signal properties of the output signals.

According to an alternative second embodiment variant, the alignment of the interconnect capacitances, and the homogenization of the signal properties of the output signals resulting herefrom, is achieved by way of an arrangement in which the actuating element is positioned between the signal output and the feedback input of each evaluation element. In particular, the actuating element is arranged in the feedback element of each evaluation element. In the present context, a significant aspect and advantage of the second embodiment variant is to be seen in the fact that, in addition to the alignment of the interconnect capacitance, an alignment of the signal properties of the output signal by way of the feedback is made possible in each evaluation element as a result of the actuating element being arranged in the feedback element. In other words, owing to the arrangement of the actuating element in the feedback element, a more accurate alignment of the signal properties of the output signals is achieved compared to the arrangement in which the actuating element is positioned at the signal input of the amplifier element. The second embodiment variant has proven advantageous in particular with regard to the homogeneous response behavior, i.e. with regard to a homogeneous output signal for further processing by the signal processing unit.

Preferably, the actuating element is set on the basis of a simulation and/or on the basis of a calibration process. By calibration process is to be understood for example that representative measurement signals are fed into the evaluation unit, the output signals of which are known with regard to their signal properties (in particular their pulse width). The generated output signals are subsequently captured and compared in terms of their measured signal properties with the known output signals. A deviation of the measured values for the signal properties, for example pulse width and/or pulse height, subsequently serves for an adjustment of the actuating element.

The setting of the actuating element by way of the simulation and/or the calibration process is realized for example on a one-time basis in the course of the development and/or an (initial) commissioning of the radiation detector. Calibration data and/or setting data are stored for example in the respective ASIC of an evaluation element. Alternatively, an alignment of the signal properties of the output signals is achieved by a suitable selection of different actuating elements.

Alternatively or in addition, the actuating element is set as a function of temperature and/or usage, for example. In this case, in the present context, in contrast to the already mentioned one-time setting, an alternate setting of the actuating element is carried out with regard for example to regions of a patient's body that are of interest to a physician. In other words, the actuating element is set by an operator, for example as a function of the object that is to be examined, of which images are acquired. By object, in the present context, is understood preferably a human organ; alternatively, object is understood generally as meaning an entity that is to be X-rayed, for example in the course of a security check at an airport or in the context of an analysis of a piece of material.

Because different objects exhibit different radiation characteristics and consequently have different energy thresholds, the setting in the alternative embodiment is carried out as a function of a likely energy threshold of the sensor signal for a scan, for example of the lung, of the patient. As a result, an optimal usage-specific homogenization of the pulse shape is achieved, and consequently an optimal image quality. The usage-specific setting of the actuating element is effected for example in the course of each treatment preparation at the time of powering up or preparing the radiation detector.

Experimental measurements have revealed that the interconnect capacitances of the electrical interconnect elements have in particular different values preferably in a range between 10 fF and 10 pF, in particular in a range of 50 fF to 1 pF, and specifically in a range of 100 fF to 500 fF.

Preferably, the actuating element comprises a capacitor, for example a fringe capacitor. In a cross-section, the fringe capacitor has for example in particular a shape in the manner of two interdigitated combs. The advantage is that a simple and cost-effective implementation of the balancing capacitance is achieved via the capacitor. Alternatively, the actuating element comprises a parallel-plate capacitor.

In order to enable the balancing of the interconnect capacitances, the capacitors of the actuating elements are beneficially embodied and/or configured in such a way that they have different balancing capacitances—analogously to the values of the interconnect capacitances—preferably with values in a range between 10 fF and 10 pF, in particular in a range of 50 fF to 1 pF, and specifically in a range of 100 fF to 500 fF.

Preferably, the different balancing capacitances of the capacitors of the actuating elements of the evaluation elements arranged in a peripheral region of the evaluation unit have a lower value than the balancing capacitances in a central region.

According to a beneficial development, the different balancing capacitances of the capacitors of the actuating elements of the evaluation elements arranged in a peripheral region of the evaluation unit have a value in the range of 1 fF to 100 fF.

Analogously, the different balancing capacitances of the capacitors of the actuating elements of the evaluation elements arranged in a central region of the evaluation unit have a value in the range of 350 fF to 600 fF.

This development is based on the consideration that lower capacitance values must be set on the part of the balancing capacitances in the peripheral region of the evaluation unit than for example in the central region of the evaluation unit.

Peripheral region is understood in the present context to mean a part of the surface area of the evaluation unit which extends from the outer edges of the evaluation unit for example in the manner of a perimetric frame in the direction of a center of the evaluation unit. For example, the peripheral region covers up to one third or up to half of the total surface area of the evaluation unit.

Central region is understood analogously in the present context to mean the difference between the total surface area of the evaluation unit and the surface area of the peripheral region.

The electrical interconnect element preferably comprises a wiring rerouting element in the manner of an interposer. By such, a technically simple and low-cost electrical connection is achieved between the sensor elements and the evaluation elements.

Alternatively, the sensor unit comprises an integrated wiring arrangement, for example. By integrated wiring, in the present context, is to be understood for example a wire layer having a plurality of electrical lines which is arranged on a surface of the sensor element and electrically connects the sensor elements to the associated evaluation elements.

The radiation detector is preferably embodied as a photon-counting X-ray detector. The advantage of the embodiment is to be seen in the fact that the already described effects (pile-up effect and paralysis effect) have a negative impact in particular in the case of photon-counting X-ray detectors. The effects are precluded, in particular in the case of an X-ray detector of such type, as a result of aligning the signal properties of the output signals.

At least one embodiment of the invention is directed to a method for operating a radiation detector.

FIG. 1 shows a sensor unit 4 having a plurality of sensor elements 6 and an evaluation unit 8 having a plurality of evaluation elements 10. Both the sensor unit 4 and the evaluation unit 8 are arranged together in a radiation detector 2. In the example embodiment, the radiation detector 2 is embodied as a photon-counting X-ray detector, for example as a direct converter. Radiation detectors of such type find application for example in the medical diagnostics field for examination purposes and/or in security-sensitive areas, for example in security zones of an airport for checking items of baggage and/or persons. During operation, the radiation detector is irradiated with X-ray radiation R. The radiation detector is in particular part of an X-ray machine which, in addition to the radiation detector, also comprises a radiation source (not shown in the example embodiment).

In the example embodiment, the evaluation unit 8 is embodied as an application-specific integrated circuit (ASIC). This enables the circuit to be realized explicitly to cater for a specified application—in the present context: X-ray diagnostics.

For reasons of simplified presentation and a relevance not present for FIG. 1, an explicit depiction of the radiation detector 2 is omitted in FIG. 1.

In the example embodiment, both the sensor unit 4 and the evaluation unit 8 are embodied in the manner of an array. In this arrangement, the number of evaluation elements 10 corresponds to the number of sensor elements 6. Accordingly, an evaluation element 10 is associated with each sensor element 6, as a result of which the radiation detector comprises a plurality (nine in the example embodiment) of sensor element-evaluation element pairs (SAPs) 11.

To realize the electrical connection, each SAP 11 comprises an electrical interconnect element 12. The electrical interconnect element 12 has for example a strand-shaped electrical line having at least one line element made of an electrically conductive material, for example copper, aluminum or tungsten, or is formed from a material of such type. Alternatively, the electrical interconnect element is embodied for example as a conductor track on a printed circuit board. In the example embodiment, the SAPs 11 are electrically connected via a wiring rerouting element, in particular via an interposer 14.

In the example embodiment, the sensor unit 4 and the evaluation unit 8 are each embodied as a ball-grid array (BGA), as a result of which the electrical interconnect element 12 additionally comprises electrical interconnect balls 16. The interconnect balls 16 are arranged in the example embodiment in particular at terminals of the interposer 14. In the example embodiment, the interconnect balls 16 have a diameter with a value in the range of 20 μm to 50 μm.

In the example embodiment, the evaluation unit 8 has a smaller surface area, for example by at least more than 10%, in particular by more than 40%, than the sensor unit 4.

Accordingly, a length of the electrical interconnect elements 12 varies within the interposer 14 as a function of a local positioning of the SAP 11.

The electrical interconnect elements 12 have a greater length in particular in a peripheral region 18 of the sensor unit 4 and the evaluation unit 8 than for example in a central region 20. In the example embodiment, the electrical connections, inclusive of the length of the interconnect balls 16 in the central region 22, have a length with a value in the range of 10 μm to 300 μm, and in the peripheral region 18 a length with a value in the range of 1 mm to 4 cm.

As a result of the different lengths of the electrical interconnect elements 12, the latter exhibit different parasitic effects, in particular interconnect capacitances 22, for example parasitic capacitances.

The interconnect capacitances 22 lead to different signal properties being exhibited by the individual output signals of the evaluation unit 8. In a further processing step, for example to produce an (X-ray) image, the different signal properties result in unwanted degradations of the image quality.

Figure 2:
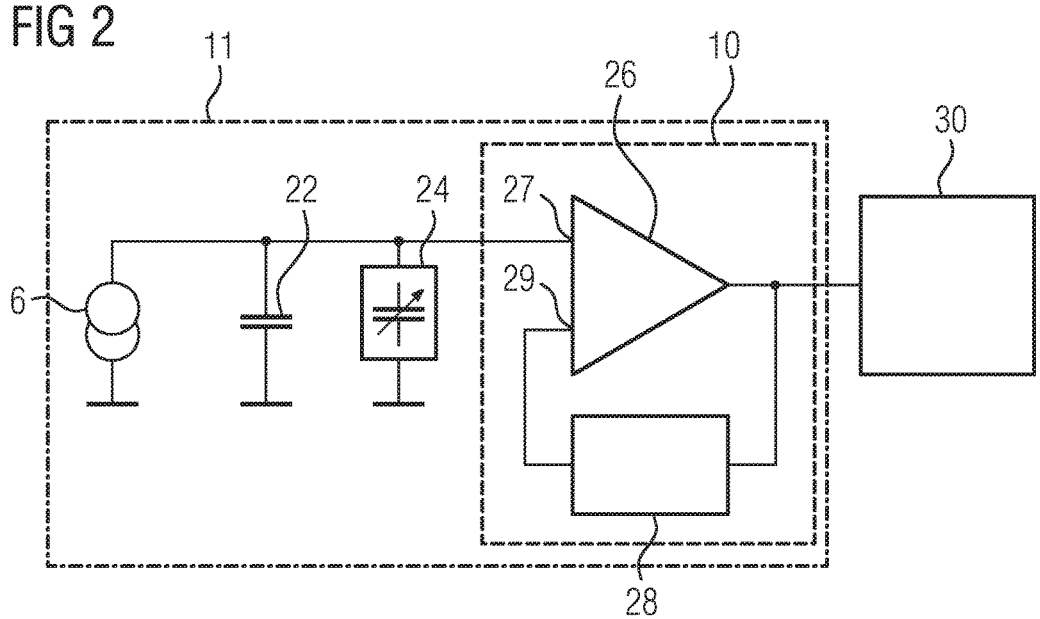
Figure 3:
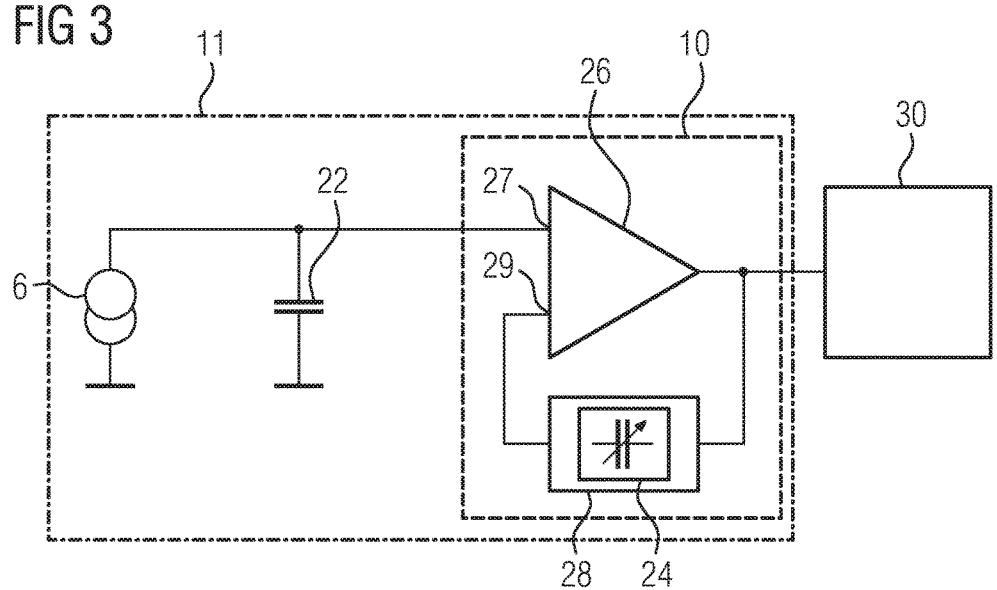

In order to align the different signal properties, in particular with regard to a pulse shape and/or a noise of the output signals, a circuit of a radiation detector 2 according to a first embodiment variant is shown in a greatly simplified block diagram in FIG. 2. In the example embodiment, each evaluation element 10 has such a circuit.

The circuit according to the first embodiment variant comprises the sensor unit 4, an interconnect capacitance 22, an actuating element 24, as well as an amplifier element 26 having a feedback element 28, and a signal processing unit 30. The amplifier element 26 additionally comprises a signal input 27, a signal output 25 and a feedback input 29. In the example embodiment, the feedback element 28 connects the signal output 25 to the feedback input 29.

By way of explanation of the circuit, a brief description of the purpose of the circuit, in particular of the actuating element 24, is given below:

In the example embodiment, the actuating element 24 comprises an adjustable capacitor, for example a fringe capacitor. Alternatively, the actuating element 24 comprises a conventional parallel-plate capacitor.

By adjustable, in the present context, is to be understood that the value of the capacitance of the capacitor is set, for example in the course of a calibration process during the commissioning of the radiation detector 2, to the interconnect capacitance 22 of the respective electrical interconnect element 12 in such a way that, due to a parallel connection of the individual capacitance 22 and of the actuating element 24, the capacitance values of the two capacitances 22,24 are added together to form a common balancing capacitance value.

The setting of at least some of the remaining actuating elements 24 is likewise carried out in such a way that the same balancing capacitance value is produced based on a parallel connection of the two capacitances 22,24. This results in the output signals of the evaluation elements exhibiting the same signal properties, which, for example during the subsequent processing of the output signal inside the signal processing unit 30, leads to a qualitatively more homogeneous image generation than if the output signals were to exhibit a plurality of different signal properties.

In the example embodiment, the actuating element 24 is arranged at, in particular connected to, the signal input 27 for this purpose.

The amplifier element 26 is embodied for example as an operational amplifier. Alternatively, the amplifier element is embodied as a transimpedance amplifier.

In the example embodiment, the amplifier element 26 comprises, as feedback element 28, an impedance, for example an ohmic resistance, and in addition, in the second embodiment variant, a capacitor, for example.

In the example embodiment, the signal processing unit 30 is embodied for example to perform the energy threshold quantification of the output signal.

An alignment of the signal properties of the output signals is therefore achieved via the circuit variant shown in FIG. 2, in particular as a result of balancing the different individual capacitances 22.

According to a second variant, an alignment of the signal properties of the output signals is achieved by way of an arrangement of the actuating element 24 inside the feedback element 28.

A greatly simplified block diagram of a circuit of a radiation detector according to such a second embodiment variant is shown in FIG. 2. Analogously to the circuit illustrated in FIG. 1, the circuit shown in FIG. 2 is likewise arranged in each case as an alternative in each evaluation element in the example embodiment.

Analogously to the embodiment illustrated in FIG. 1, the circuit of the variant shown in FIG. 2 likewise comprises the sensor unit 4, an interconnect capacitance 22, which has a different value as a function of the length of the electrical interconnect element 12, the amplifier element 26, as well as the feedback unit 28 and the signal processing unit 30.

However, according to this embodiment variant, the actuating element 24 is arranged inside the feedback element 28 and is therefore connected to the feedback input 29 of the amplifier element 26. An alignment of the signal properties of the output signals is achieved as a result, in particular with regard to a feedback alignment. In other words, according to the second embodiment variant, in order to align the signal properties of the output signals, in addition to a balancing of the individual capacitances 22, an approximation is made possible with regard to a tolerable deviation from the balancing capacitance value, provided that, in the case of a deviation from the balancing capacitance value (and consequently a conscious renunciation of exactly balanced interconnect capacitances), an added value is achieved with regard to the aligned signal properties of the output signals.

The patent claims of the application are formulation proposals without prejudice for obtaining more extensive patent protection. The applicant reserves the right to claim even further combinations of features previously disclosed only in the description and/or drawings.

References back that are used in dependent claims indicate the further embodiment of the subject matter of the main claim by way of the features of the respective dependent claim; they should not be understood as dispensing with obtaining independent protection of the subject matter for the combinations of features in the referred-back dependent claims. Furthermore, with regard to interpreting the claims, where a feature is concretized in more specific detail in a subordinate claim, it should be assumed that such a restriction is not present in the respective preceding claims.

Since the subject matter of the dependent claims in relation to the prior art on the priority date may form separate and independent inventions, the applicant reserves the right to make them the subject matter of independent claims or divisional declarations. They may furthermore also contain independent inventions which have a configuration that is independent of the subject matters of the preceding dependent claims.

None of the elements recited in the claims are intended to be a means-plus-function element within the meaning of 35 U.S.C. § 112(f) unless an element is expressly recited using the phrase "means for" or, in the case of a method claim, using the phrases "operation for" or "step for."

Example embodiments being thus described, it will be obvious that the same may be varied in many ways. Such variations are not to be regarded as a departure from the spirit and scope of the present invention, and all such modifications as would be obvious to one skilled in the art are intended to be included within the scope of the following claims.

What is claimed is:

1. A radiation detector, comprising:
a sensor, including a plurality of sensor elements, to generate a sensor signal;
an evaluation unit, including a plurality of evaluation elements, to evaluate and convert the sensor signal into an output signal; and
a signal processor, directly following the evaluation unit, to process the output signal, wherein each of the plurality of evaluation elements is connected to an associated one of the plurality of sensor element via a respective one of a plurality of electrical interconnect elements including an interconnect capacitance and an individual length, respective interconnect capacitances, of the respective ones of the plurality of electrical interconnect elements, being different from other interconnect capacitances and, as a result, leading to different signal properties being exhibited by respective output signals, at least some of the plurality of evaluation elements including an actuating element, actuating elements of different respective ones of the plurality of evaluation elements being different from other respective ones of the plurality of evaluation elements and being chosen to align the different signal properties of the output signals, wherein each of the plurality of evaluation elements comprises an ASIC including an amplifier element.

2. The radiation detector of claim 1, wherein the actuating elements each include a balancing capacitance and wherein balancing capacitances of different respective actuating elements are different in value, from other respective actuating elements.

3. The radiation detector of claim 2, wherein the actuating element is set based upon at least one of a simulation process and a calibration process.

4. The radiation detector of claim 2, wherein the actuating element includes a capacitor having a balancing capacitance.

5. The radiation detector of claim 4, wherein the balancing capacitance of a capacitor of one of the plurality of evaluation elements arranged in a peripheral region has a relatively lower capacitance than the balancing capacitance of a capacitor of one of the plurality of evaluation elements arranged in a central region.

6. The radiation detector of claim 5, wherein at least one of
the balancing capacitance of the capacitor of one of the plurality of evaluation elements arranged in a peripheral region has a capacitance with a value in a range of 1 fF to 300 fF, and
the balancing capacitance of the capacitor of one of the plurality of evaluation elements arranged in a central region has a capacitance with a value in a range of 200 fF to 1000 fF.

7. The radiation detector of claim 4, wherein at least one of
the balancing capacitance of the capacitor of one of the plurality of evaluation elements arranged in a peripheral region has a capacitance with a value in a range of 1 f F to 300 fF, and
the balancing capacitance of the capacitor of one of the plurality of evaluation elements arranged in a central region has a capacitance with a value in a range of 200 fF to 1000 fF.

8. The radiation detector of claim 2, wherein the balancing capacitance has a value in the range of 10 fF to 10 pF.

9. The radiation detector of claim 8, wherein the balancing capacitance has a value in a range between 50 fF and 1 pF.

10. The radiation detector of claim 8, wherein the balancing capacitance has a value in a range of 100 fF to 500 fF.

11. The radiation detector of claim 2, wherein the actuating elements are adjustable.

12. The radiation detector of claim 1, wherein the actuating elements are adjustable.

13. The radiation detector claim 1, wherein the amplifier element includes a signal input, a feedback input, a signal output and a feedback element, connecting the signal output to an input of the feedback input.

14. The radiation detector of claim 13, wherein the actuating element is positioned upstream of the signal input.

15. The radiation detector of claim 13, wherein the actuating element is arranged between the signal output and the feedback input.

16. The radiation detector of claim 15, wherein the actuating element is arranged between the signal output and the feedback input in the feedback element.

17. The radiation detector of claim 1, wherein the interconnect capacitances each have a respective different value in a range of 10 fF to 10 pF.

18. The radiation detector of claim 17, wherein the interconnect capacitances each have a respective different value in a range between 50 fF and 1 pF.

19. The radiation detector of claim 17, wherein the interconnect capacitances each have a respective different value in a range between 100 fF to 500 fF.

20. The radiation detector of claim 1, wherein the plurality of electrical interconnect elements each include a wiring rerouting element.

21. The radiation detector of claim 20, wherein the wiring rerouting element is an interposer.

22. A method for operating a radiation detector including a sensor including a plurality of sensor elements for generating a sensor signal, an evaluation unit including a plurality of evaluation elements for evaluating and converting the sensor signal into an output signal, and a signal processing unit directly following the evaluation unit for processing the output signal, the method comprising:

connecting each of the plurality of evaluation elements to an associated one of the plurality of sensor elements via a respective one of a plurality of electrical interconnect elements, each of the respective one of a Plurality of electrical interconnect elements including an interconnect capacitance and an individual length, the interconnect capacitance of each respective one of a plurality of electrical interconnect elements being different and leading to different signal properties being exhibited by the respective output signals, at least some of the plurality of evaluation elements including an actuating element, wherein the actuating element of different ones of the plurality of evaluation elements are different from actuating elements of other different ones of the plurality of evaluation elements and are chosen to align the different signal properties of the output signals, wherein each of the plurality of evaluation elements comprises an ASIC including an amplifier element.

23. The radiation detector of claim 1, wherein the radiation detector is an X-ray detector.

* * * * *